United States Patent
Chandhok et al.

(10) Patent No.: US 10,256,141 B2
(45) Date of Patent: Apr. 9, 2019

(54) MASKLESS AIR GAP TO PREVENT VIA PUNCH THROUGH

(71) Applicant: Intel Corporation, Santa Clara, CA (US)

(72) Inventors: Manish Chandhok, Beaverton, OR (US); Todd R. Younkin, Cary, NC (US); Eungnak Han, Portland, OR (US); Jasmeet S. Chawla, Hillsboro, OR (US); Marie Krysak, Portland, OR (US); Hui Jae Yoo, Hillsboro, OR (US); Tristan A. Tronic, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/744,018

(22) PCT Filed: Sep. 23, 2015

(86) PCT No.: PCT/US2015/051729
§ 371 (c)(1),
(2) Date: Jan. 11, 2018

(87) PCT Pub. No.: WO2017/052536
PCT Pub. Date: Mar. 30, 2017

(65) Prior Publication Data
US 2018/0204760 A1    Jul. 19, 2018

(51) Int. Cl.
*H01L 21/331*    (2006.01)
*H01L 21/768*    (2006.01)
*H01L 23/522*    (2006.01)
*H01L 23/532*    (2006.01)

(52) U.S. Cl.
CPC .... *H01L 21/7682* (2013.01); *H01L 21/76802* (2013.01); *H01L 21/76832* (2013.01); *H01L 21/76834* (2013.01); *H01L 21/76897* (2013.01); *H01L 23/5222* (2013.01); *H01L 23/5226* (2013.01); *H01L 23/53238* (2013.01)

(58) Field of Classification Search
CPC ...................... H01L 21/7682; H01L 21/76802
USPC .......................................... 438/319, 411, 619
See application file for complete search history.

(56) References Cited

U.S. PATENT DOCUMENTS

| | | | | |
|---|---|---|---|---|
| 6,815,329 | B2 * | 11/2004 | Babich | H01L 21/7681 257/E21.579 |
| 7,071,532 | B2 * | 7/2006 | Geffken | H01L 21/76811 257/522 |
| 7,534,696 | B2 * | 5/2009 | Jahnes | H01L 21/7682 257/E21.573 |

(Continued)

OTHER PUBLICATIONS

International Search Report and Written Opinion for International Patent Application No. PCT/US2015/051729 dated Jun. 13, 2016, 11 pgs.

(Continued)

*Primary Examiner* — Nitin Parekh
(74) *Attorney, Agent, or Firm* — Schwabe, Williamson & Wyatt, P.C.

(57) ABSTRACT

A first etch stop layer is deposited on a plurality of conductive features on an insulating layer on a substrate. A second etch stop layer is deposited over an air gap between the conductive features. The first etch stop layer is etched to form a via to at least one of the conductive features.

20 Claims, 13 Drawing Sheets

(56) References Cited

U.S. PATENT DOCUMENTS

| | | | |
|---|---|---|---|
| 2002/0127844 A1* | 9/2002 | Grill | H01L 21/7682 438/622 |
| 2004/0061230 A1* | 4/2004 | Powers | H01L 21/7682 257/758 |
| 2005/0230836 A1* | 10/2005 | Clarke | H01L 21/7682 257/760 |
| 2006/0057835 A1* | 3/2006 | Anderson | H01L 21/76802 438/619 |
| 2007/0259516 A1* | 11/2007 | Jahnes | H01L 21/7682 438/618 |
| 2009/0309230 A1 | 12/2009 | Cui et al. | |
| 2011/0183516 A1 | 7/2011 | Lee | |
| 2013/0134590 A1 | 5/2013 | Nogami et al. | |
| 2014/0306351 A1* | 10/2014 | Kim | H01L 21/76855 257/774 |
| 2014/0349481 A1 | 11/2014 | Tsai et al. | |
| 2015/0008503 A1* | 1/2015 | Makala | H01L 27/11582 257/324 |
| 2015/0137378 A1 | 5/2015 | Wu et al. | |
| 2016/0093635 A1* | 3/2016 | Rabkin | H01L 21/02381 257/314 |

OTHER PUBLICATIONS

International Preliminary Search Report for International Patent Application No. PCT/US2015/051729 dated Apr. 5, 2018, 8 pages.

* cited by examiner

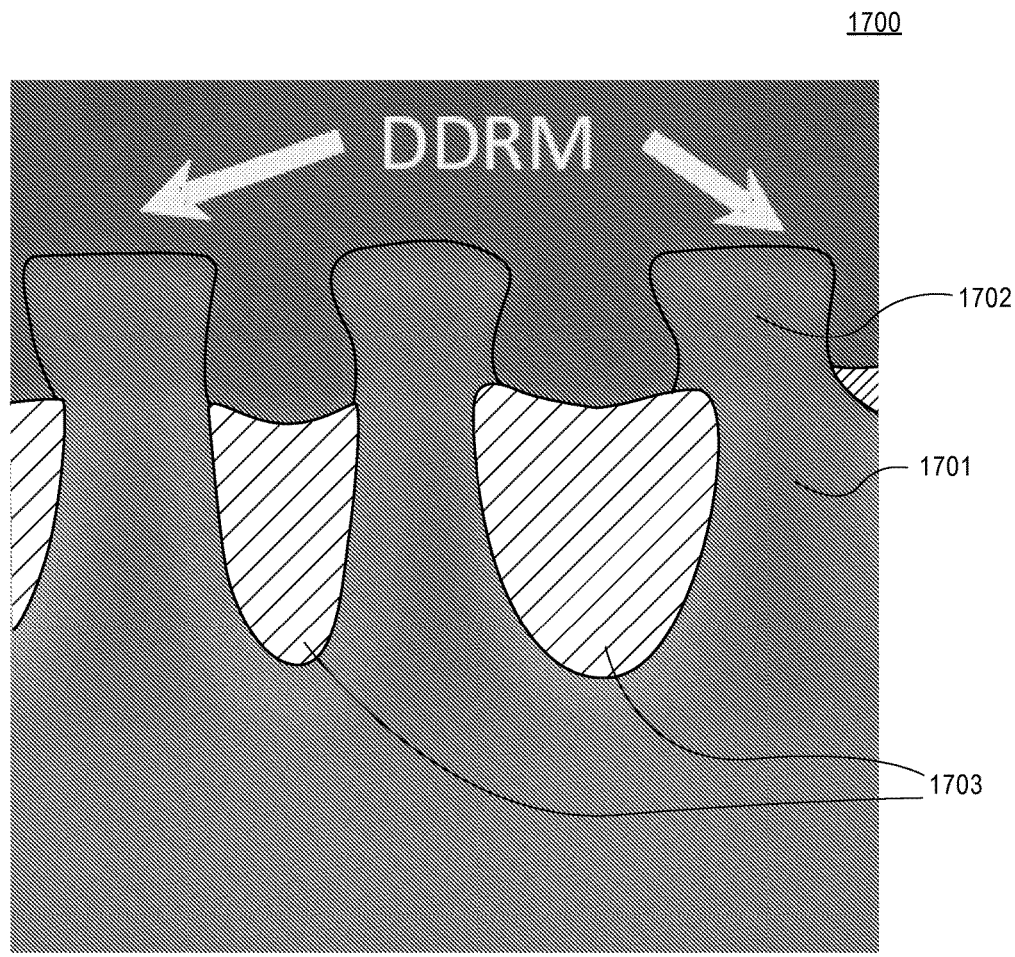
FIG. 17
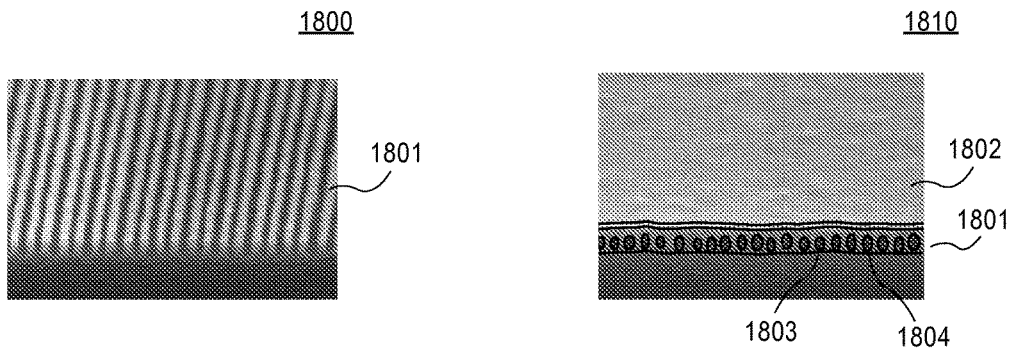
FIG. 18A  FIG. 18B

MASKLESS AIR GAP TO PREVENT VIA PUNCH THROUGH

CROSS-REFERENCE TO RELATED APPLICATION

This patent application is a U.S. National Phase Application under 35 U.S.C. § 371 of International Application No. PCT/US2015/051729, filed Sep. 23, 2015, entitled "MASKLESS AIR GAP TO PREVENT VIA PUNCH THROUGH," which designates the United States of America, the entire disclosure of which is hereby incorporated by reference in its entirety and for all purposes.

FIELD

Embodiments as described herein relate to a field of electronic device manufacturing, and in particular, to an integrated circuit manufacturing.

BACKGROUND

Generally, an integrated circuit (IC) refers to a set of electronic devices, e.g., transistors formed on a small chip of semiconductor material, typically, silicon. Typically, an interconnect structure incorporated into the IC includes one or more levels of metal lines to connect the electronic devices of the IC to one another and to external connections. An interlayer dielectric is placed between the metal levels of the IC for insulation. Generally, the efficiency of the interconnect structure depends on the resistance of each metal line and the coupling capacitance generated between the metal lines. Typically, to reduce the resistance and increase the IC performance, copper interconnect structures are used.

As the size of the IC decreases, the spacing between the metal lines decreases. This leads to increase in the coupling capacitance between the metal lines. Increase in the coupling capacitance between the metal lines has a negative impact on signal transmission along metal lines. Furthermore, increase in the coupling capacitance increases energy consumption of the integrated circuit.

One conventional technique to reduce the capacitive coupling between adjacent metal lines involves replacing a high k dielectric material that separates the metal lines with a low k dielectric material. Another conventional technique to reduce the capacitive coupling involves forming an air gap between adjacent metal lines.

Conventional techniques cannot typically prevent the unlanded via from punching through the air gap that causes shorts. Typically in the conventional techniques, a hard mask is deposited that blocks the air gap etch in the underlying interconnect layer above which the next interconnect layer via lands.

As the backend interconnect pitch becomes smaller, the regions that need to be masked to prevent etching of the air gap become closer. Generally, the conventional techniques that involve masking off vias locally do not scale with pitch. Typically, the mask layer patterning requires multiple lithography passes and complicated Optical proximity correction OPC) that significantly increases manufacturing cost and reduces yield.

BRIEF DESCRIPTION OF THE DRAWINGS

Embodiments of the invention may be best understood by referring to the following description and accompanying drawings that are used to illustrate embodiments of the invention. In the drawings:

FIG. 17 shows an image of a portion of the electronic device after selectively etching a PS component of the DSA material according to one embodiment.

FIG. 18A shows an image of a portion of an electronic device similar to FIG. 8 before depositing a nanoparticle material etch stop layer according to one embodiment.

FIG. 18B is an image similar to FIG. 18A the after baking and spinning on a nanoparticle material etch stop layer according to one embodiment.

DETAILED DESCRIPTION

Figure 1:
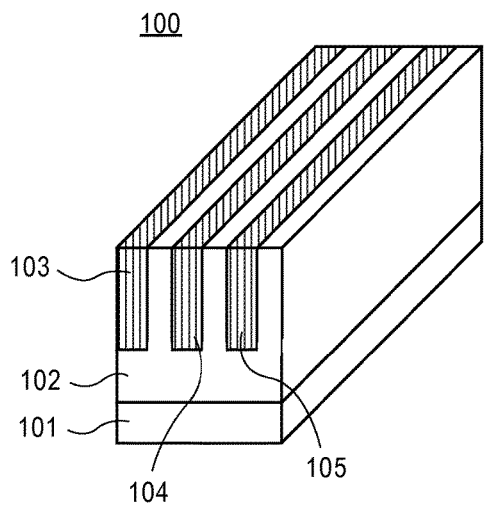
FIG. 1 shows a three dimensional view of a portion of an electronic device according to one embodiment.

Methods and apparatuses to provide a maskless air gap to prevent a via from punching through an air gap are described. Embodiments described herein provide a patterning process that does not need a masked air gap. In at least some embodiments, an air gap between conductive features is advantageously capped with a self-aligned, multiple via etch stop materials so that the via etch is steered to land only over the conductive feature and away from the air gap.

In at least some embodiments, to prevent the via from punching the air gap between the conductive lines an etch stop (ES) is advantageously deposited above the air gap that does not etch during the via etch. Conversely, the ES above the conductive lines is selectively etched during the via etch. That is, the via etch selectively etches the ES over the metal while the ES over the air gap is preserved.

In one embodiment, the ES is self-aligned to the conductive feature using a directed self-assembly (DSA) material, as described in further detail below. In one embodiment, the ES materials over the conductive feature and over the air gap have high etch selectivity to each other. In one embodiment, the ES material deposited over the conductive feature is a flowable nitride material. In one embodiment the ES material deposited over the air gap is a spin on metallic nanoparticle material.

In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without specific details. In other instances, well-known features are omitted or simplified in order not to obscure the illustrative implementations.

Various operations will be described as multiple discrete operations, in turn, in a manner that is most helpful in understanding the present invention; however, the order of description should not be construed to imply that these operations are necessarily order dependent. In particular, these operations need not be performed in the order of presentation.

While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration as described herein. The description is thus to be regarded as illustrative rather than limiting.

In one embodiment, a first etch stop layer is deposited on a plurality of conductive features on an insulating layer on a substrate. A second etch stop layer is deposited over an air gap between the conductive features. The first etch stop layer is etched to form a via to at least one of the conductive features.

FIG. 1 shows a three-dimensional view 100 of a portion of an electronic device according to one embodiment. A plurality of conductive features 103, 104 and 105 are formed on an insulating layer 102 on a substrate 101.

In an embodiment, the substrate 101 comprises a semiconductor material, e.g., silicon (Si). In one embodiment, substrate 101 is a monocrystalline Si substrate. In another embodiment, substrate 101 is a polycrystalline silicon substrate. In another embodiment, substrate 101 represents a previous interconnect layer. In yet another embodiment, substrate 101 is an amorphous silicon substrate. In alternative embodiments, substrate 101 includes silicon, germanium ("Ge"), silicon germanium ("SiGe"), a III-V materials based material e.g., gallium arsenide ("GaAs"), or any combination thereof. In one embodiment, the substrate 101 includes metallization interconnect layers for integrated circuits. In at least some embodiments, the substrate 101 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In at least some embodiments, the substrate 101 includes interconnects, for example, vias, configured to connect the metallization layers.

In an embodiment, substrate 101 is a semiconductor-on-isolator (SOI) substrate including a bulk lower substrate, a middle insulation layer, and a top monocrystalline layer. The top monocrystalline layer may comprise any material listed above, e.g., silicon.

In various implementations, the substrate can be, e.g., an organic, a ceramic, a glass, or a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present invention.

In one embodiment, insulating layer 102 is an interlayer dielectric (ILD) layer. In one embodiment, insulating layer 102 is an oxide layer, e.g., a silicon oxide layer. In one embodiment, insulating layer 102 is a low-k dielectric, e.g., silicon dioxide, silicon oxide, carbon doped oxide ("CDO"), or any combination thereof. In one embodiment, insulating layer 102 includes a nitride, oxide, a polymer, phosphosilicate glass, fluorosilicate ("SiOF") glass, organosilicate glass ("SiOCH"), or any combination thereof. In another embodiment, insulating layer 102 is a nitride layer, e.g., silicon nitride layer. In alternative embodiments, insulating layer 102 is an aluminum oxide, silicon oxide nitride, other oxide/nitride layer, any combination thereof, or other electrically insulating layer determined by an electronic device design.

In one embodiment, the thickness of the insulating layer 102 is determined by design. In one embodiment, the insulating layer 102 is deposited to the thickness from about 50 nanometers (nm) to about 2 microns (μm). In an embodiment, insulating layer 102 is deposited on substrate 101 using one of deposition techniques, such as but not limited to a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing.

As shown in FIG. 1, conductive features 103, 104 and 105 are formed on insulating layer 102. In one embodiment, the conductive features 103, 104 and 105 are conductive lines. In alternative embodiments, the conductive features 103, 104 and 105 are conductive lines, conductive vias, trenches, or any combination thereof. In one embodiment, the distance between the conductive features (pitch) is less than about 80 nm. In one embodiment, the pitch is from about 10 nanometers (nm) to about 80 nm.

In one embodiment, the conductive features 103, 104 and 105 are formed using one of conductive feature forming techniques known to one of ordinary skill in the art of microelectronic device manufacturing. In one embodiment, the insulating layer 102 is patterned to form openings (e.g., trenches). In one embodiment, the openings in insulating layer 102 are formed using the patterning and etching techniques known to one of ordinary skill in the art of microelectronic device manufacturing. One or more conductive layers, e.g., a conductive layer on a base layer are deposited to fill the openings in the insulating layer 102. One of chemical-mechanical polishing (CMP) techniques is used to remove the portions of the one or more conductive layers that extend above the top of the insulating layer 102. The portions of the one or more conductive layers deposited within the openings in the insulating layer 102 are not removed and become the patterned conductive features, such as conductive features 103, 104 and 105. In one embodiment, the width of the conductive feature is less than about 40 nm. In one embodiment, the width of the conductive feature is in an approximate range of 5 nm ("μm") to about 40 nm. In one embodiment, the height of the conductive feature less than about 65 nm. In one embodiment, the height of the conductive feature is in the approximate range of 8 nm to 65 nm.

In one embodiment, the base layer includes a conductive seed layer deposited on a conductive barrier layer. In one embodiment, the seed layer includes copper (Cu). In another embodiment, the seed layer includes tungsten (W). In alternative embodiments, the seed layer is copper, titanium nitride, ruthenium, nickel, cobalt, tungsten, or any combination thereof. In more specific embodiment, the seed layer is copper. In one embodiment, the conductive barrier layer includes aluminum, titanium, titanium nitride, tantalum, tantalum nitride, tungsten, cobalt, ruthenium, the like metals, or any combination thereof. Generally, the conductive barrier layer is used to prevent diffusion of the conductive material from the seed layer into insulating layer 102 and to provide adhesion for the seed layer. In one embodiment, the base layer comprises the seed layer on the barrier layer that is deposited on the sidewalls and bottom of the openings in the insulating layer 102. In another embodiment, the base layer includes the seed layer that is directly deposited on the sidewalls and bottom of the openings in the insulating layer 102. Each of the conductive barrier layer and seed layer may be deposited using any thin film deposition technique known to one of ordinary skill in the art of semiconductor manufacturing, e.g., by sputtering, blanket deposition, and the like. In one embodiment, each of the conductive barrier layer and the seed layer has the thickness in the approximate range of 1 nanometers (nm) to 100 nm. In one embodiment, the barrier layer may be a thin dielectric that has been etched to establish conductivity to the metal layer below. In one embodiment, the barrier layer may be omitted altogether and appropriate doping of the copper line may be used to make a "self-forming barrier".

In one embodiment, the conductive layer of copper is deposited onto the seed layer of copper by an electroplating process. In another embodiment, the conductive layer is deposited onto the seed layer using one of selective deposition techniques known to one of ordinary skill in the art of semiconductor manufacturing, e.g., electroplating, electroless plating, or the like techniques. In one embodiment, the choice of a material for the conductive layer determines the choice of a material for the seed layer. For example, if the material for conductive layer includes copper, the material for the seed layer also includes copper. In one embodiment, conductive layer includes e.g., copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof.

In alternative embodiments, examples of the conductive materials that may be used for the conductive layer to form features 103, 104 and 105 include, but are not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In one embodiment, conductive features 103, 104 and 105 are formed by removing the portions of the conductive layer and the base layer outside the openings in the insulating layer 102. The portions of the conductive layer may be removed chemically, e.g., using etching, mechanically, e.g., using polishing, or by a combination of thereof techniques, e.g., using a chemical-mechanical polishing ("CMP") technique known to one of ordinary skill in the art of microelectronic device manufacturing.

Figure 2:
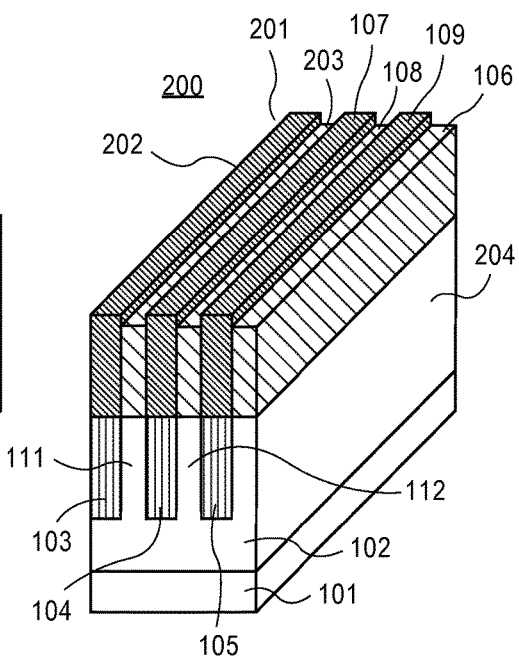
FIG. 2 is a view similar to FIG. 1 after a first sacrificial layer is deposited on a plurality of conductive features according to one embodiment.

FIG. 2 is a view 200 similar to FIG. 1 after a first sacrificial layer 201 is deposited on a plurality of conductive features according to one embodiment. Sacrificial layer 201 is deposited on conductive features 103, 104 and 105 and on portions of insulating layer adjacent to the conductive features, such as portions 111 and 112. In one embodiment, sacrificial layer 201 is a DSA material layer. In one embodiment, the material of the sacrificial layer 201 comprises a first component and a second component that is different from the first component. In one non-limiting exemplary embodiment, the first component of the DSA material layer is a polymethyl methacrylate (PMMA) material and the second component of the DSA material layer is a polystyrene (PS) material. In other embodiments, other materials are used as the first and second components of the sacrificial layer.

As shown in FIG. 2, portions 202, 107 and 109 of the first component of the sacrificial layer material 201 are deposited on top portions of the conductive features 103, 104 and 105 respectively. Portions 203, 106 and 108 of the second component of the material of the sacrificial layer 201 are deposited on top portions of the insulating layer, such as portions 111, 112 and 204 respectively. In one embodiment, sacrificial layer 201 is cured to segregate first component and the second component, to that the portions of the first component of the sacrificial layer material are self aligned to portions of the insulating layer between the conductive features and portions of the second component of the sacrificial layer material are self-aligned to the conductive features. In one embodiment, the composition of the DSA material depends on the pitch of the underlying conductive pattern. The pitch of the DSA materials depends on the molecular weights of the individual components (e.g., PS and PMMA), and thy ratio of the individual components (e.g., PS:PMMA) can also be modified to match the duty cycle of the conductive versus non-conductive portions of the underlying pattern. In one embodiment, the portions of the first component of the sacrificial layer material are self-aligned to portions of the insulating layer 102 and the portions of the second component of the sacrificial layer material are self-aligned to the conductive features 103, 104 and 105 by annealing at a temperature from about 120 degrees C. to about 300 degrees C. During the annealing, the PMMA component and PS component of the DSA material phase separate to self align to the ILD and metal (e.g., tungsten, copper, or other metal) respectively. In one embodiment, the top surface of the conductive features and the insulating layer is pre-treated before depositing the DSA material. For example, the pre-treatments can include reduction or removal of the native oxide of the conductive portion by plasma reducing agents (NH3, H2, H2/H2, or combinations thereof) or wet clean chemical cleaning agents (e.g., citric acid, ammonium hydroxide, and the like).

Generally, the maximum thickness of the sacrificial layer 201 is determined by the pitch (e.g., 1.3×pitch). However, the thicknesses of the etch stop layers in the stack need to be less than about 20 nm to avoid increase in dielectric constant in the stack. In one embodiment, the thickness of the sacrificial layer 201 is determined by the thickness of the etch stop layers deposited later on in a process. In one embodiment, the sacrificial layer 201 is deposited to the thickness from about 2 nm to about 20 nm. In more specific embodiment, the sacrificial layer 201 is deposited to the thickness from about 5 nm to about 15 nm.

In one embodiment, sacrificial layer 201 is deposited using one of deposition techniques, such as but not limited to a spin-on, a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

Figure 3:
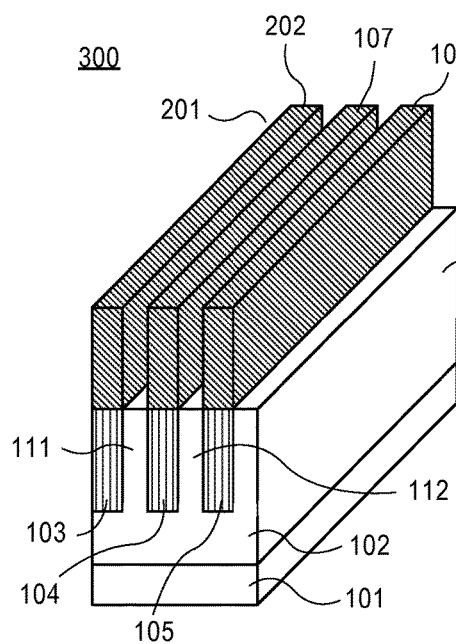
FIG. 3 is a view similar to FIG. 2 after portions of the first component of the first sacrificial layer material are removed to expose top portions of the insulating layer according to one embodiment.

FIG. 3 is a view 300 similar to FIG. 2 after the portions of the first component of the sacrificial layer material 201 are removed to expose top portions of the insulating layer 102 according to one embodiment. As shown in FIG. 3, the portions 202, 107 and 109 of the second component of the sacrificial material layer remain on the conductive features 103, 104 and 105 and the portions 111, 112 and 204 of the insulating layer 102 are exposed.

In one embodiment, the portions of the first components of the sacrificial material layer are selectively removed using one or more of wet etching, dry etching, or a combination thereof techniques known to one of ordinary skill in the art of electronic device manufacturing.

Figure 15:
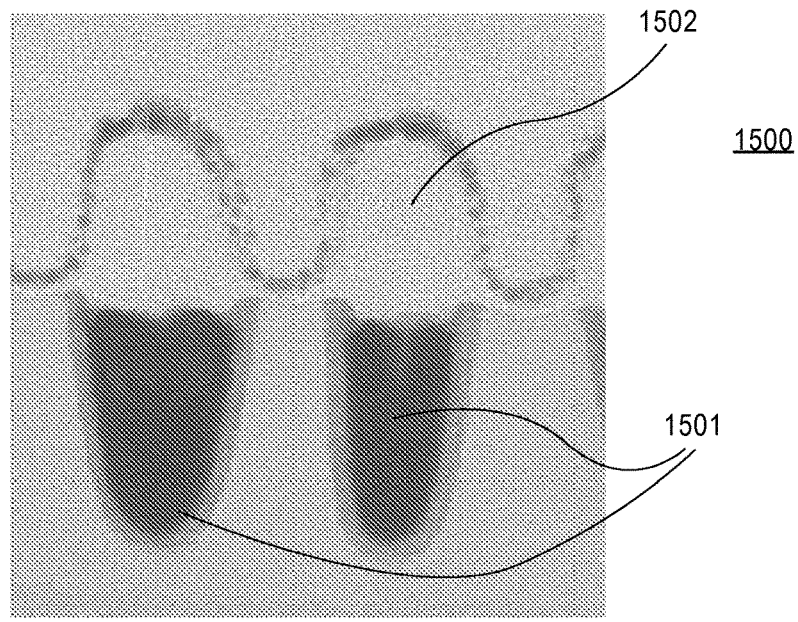
FIG. 15 shows an image of a portion of the electronic device after selectively removing the portions of the PMMA component of the DSA material according to one embodiment.

FIG. 15 shows an image 1500 of a portion of the electronic device after selectively removing the portions of the PMMA component of the DSA material according to one embodiment. As shown in image 1500, the PMMA component of the DSA material is selectively etched while leaving intact the PS component of the DSA material 1502 above the conductive features 1501 of tungsten (W).

Figure 4:
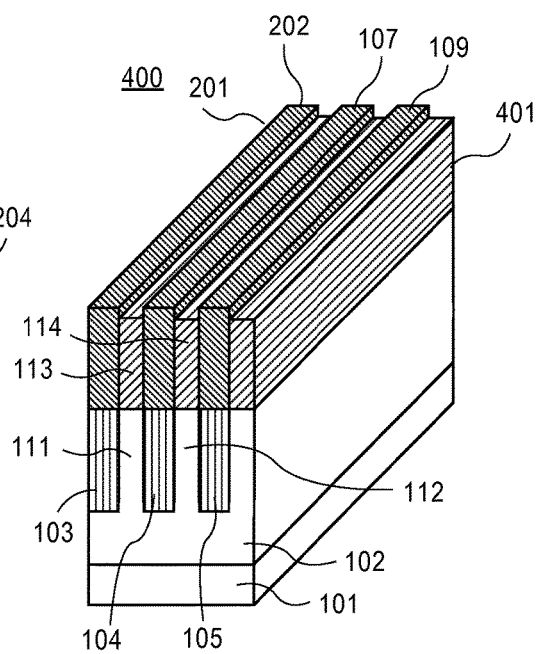
FIG. 4 is a view similar to FIG. 3 after a second sacrificial layer is deposited on the exposed portions of the insulating layer according to one embodiment.

FIG. 4 is a view 400 similar to FIG. 3 after a second sacrificial layer 401 is deposited on the exposed portions of the insulating layer 102 according to one embodiment. The sacrificial layer 401 is etched back to reveal portions 201, 107 and 109 of the sacrificial layer 201. As shown in FIG. 4, portions 113 and 114 of the sacrificial layer 401 are deposited on portions 111 and 112 of the insulating layer 102 respectively. In one embodiment, the second component of the sacrificial layer 201 has a substantially high etch selectivity to the sacrificial layer 401. Generally, etch selectivity between two materials is defined as the ratio between their etching rates at similar etching conditions. In one embodiment, the ratio between the etching rate of the PS component of the sacrificial layer 201 to the etching rate of the sacrificial layer 401 is at least 8:1. In one embodiment, sacrificial layer 401 is a Dry Develop Rinse Material (DDRM). Generally, DDRM is a silicon containing polymer that has substantially high etch selectivity (e.g., at least 8:1) to the PS component of the DSA material. In one embodiment, sacrificial layer 401 is a silicon oxide based polymer composition.

In one embodiment, sacrificial layer 401 is deposited using one of deposition techniques, such as but not limited to a spin-on, chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing.

Figure 5:
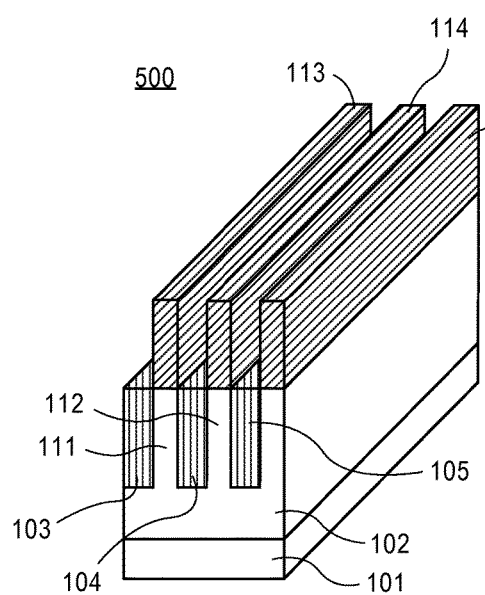
FIG. 5 is a view similar to FIG. 4 after portions of the second component of the first sacrificial material layer are removed to expose conductive features according to one embodiment.

FIG. 5 is a view 500 similar to FIG. 4 after the portions 102, 107 and 109 of the first component of the sacrificial material layer 201 are removed to expose conductive features 103, 104 and 105 according to one embodiment. As shown in FIG. 5, the portions of the sacrificial layer 401, such as portions 113 and 114 are deposited on portions of the insulating layer, such as portions 111 and 112 respectively. In one embodiment, the portions of the first component of the sacrificial material layer 201 are removed by one of plasma ashing techniques known to one of ordinary skill in the art of electronic device manufacturing.

FIG. 17 shows an image 1700 of a portion of the electronic device after selectively etching a PS component of the DSA material according to one embodiment. In one embodiment, a DDRM material deposited on an ILD layer 1701 is a silicon containing polymer that has substantially high etch selectivity to the PS component. As shown in FIG. 17, after the PS component of the DSA material is selectively etched away from conductive features of tungsten (W) 1703, a DDRM material 1702 remains on portions of the ILD layer 1701.

Figure 6:
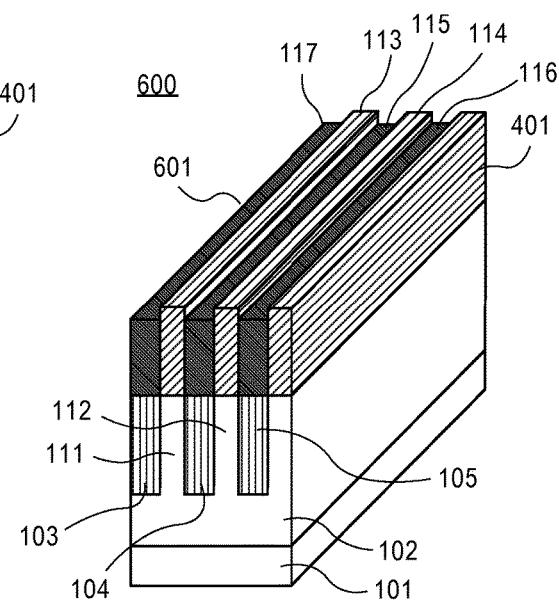
FIG. 6 is a view similar to FIG. 5 after an etch stop layer (ES1) is deposited on according to one embodiment.

FIG. 6 is a view 600 similar to FIG. 5 after an etch stop layer (ES1) 601 is deposited on according to one embodiment. As shown in FIG. 6, portions 115, 116 and 117 of the etch stop layer 601 are deposited on the exposed portions of the conductive features 103, 104 and 105 respectively. In one embodiment, etch stop layer 601 is blanket deposited on the exposed portions of the conductive features and on the sacrificial layer 401 at a temperature greater than 400 degrees C. In one embodiment, etch stop layer 601 is etched back to reveal portions of the sacrificial layer 401, such as portions 113 and 114. In one embodiment, etch stop layer 601 is highly etch selective relative to sacrificial layer 401. In one embodiment, the ratio between the etching rate of the sacrificial layer 401 to the etching rate of the etch stop layer 601 is at least 8:1. In one embodiment, the etch stop layer 601 remains substantially intact during the etch of the sacrificial layer 401 and during the etch of the air gap later on in a process. In one embodiment, the height of the portions 115, 116 and 117 of the etch stop layer 601 is greater than the height of the portions 113 and 114 of the sacrificial layer 401 to survive the etches of the sacrificial layer 401 and air gap later on in a process. In one embodiment, the thickness of the etch stop layer 601 is from about 2 nm to about 20 nm. In more specific embodiment, the thickness of the etch stop layer 601 is from about 5 nm to about 15 nm.

In one embodiment, the etch stop layer 601 comprises a fillable nitride based material, e.g., a flowable nitride. In one embodiment, the etch stop layer 601 is a silicon nitride, silicon carbide, or any combination thereof. In alternate embodiments, etch stop layer 601 is an oxide layer, e.g., a silicon oxide layer, a carbon doped oxide layer, e.g., a carbon doped silicon oxide layer, a silicon oxy carbide (SiOC) layer, a fluorine-doped silicon oxide, a metal oxide, e.g., a titanium oxide, an aluminum oxide, a hafnium oxide, or any other metal oxide; a hydrogensilesquioxane (HSQ), a fluorinated amorphous carbon, a methylsesquioxane (MSQ), a nitride layer, e.g., a silicon nitride, a titanium nitride, a silicon oxide nitride, silicon carbide, or other etch stop layer.

In one embodiment, etch stop layer 601 is deposited using one of deposition techniques, such as but not limited to a spin-on, a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing. In one embodiment, etch stop layer 601 is etched back using one or more etching techniques e.g., a dry etching, a wet etching, or both techniques known to one of ordinary skill in the art of electronic device manufacturing.

Figure 7:
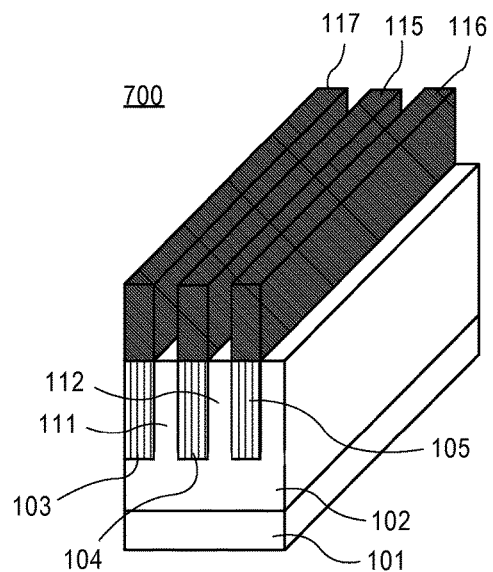
FIG. 7 is a view similar to FIG. 6 after the removal of the second sacrificial layer according to one embodiment.

FIG. 7 is a view 700 similar to FIG. 6 after the removal of the sacrificial layer 401 according to one embodiment. As shown in FIG. 7, the sacrificial layer 401 is selectively removed to expose portions (e.g., portions 111 and 112) of the insulating layer 102. The portions of the etch stop layer 601 on the conductive features 103, 104 and 105 remain intact after the removal of the sacrificial layer 401. In one embodiment, the sacrificial layer 401 is selectively removed using one or more of the etching techniques e.g., a dry etching, a wet etching, or both techniques known to one of ordinary skill in the art of electronic device manufacturing.

Figure 8:
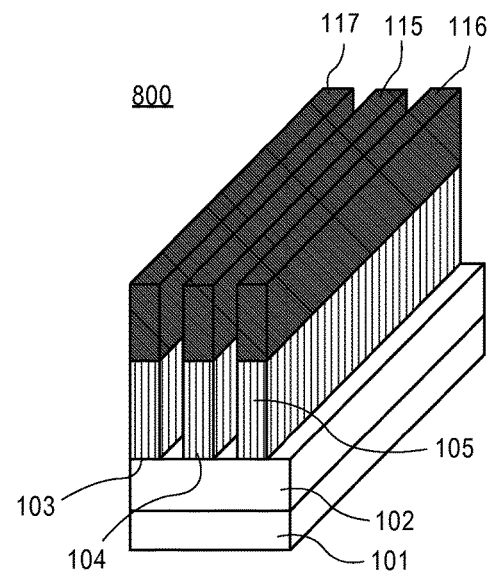
FIG. 8 is a view similar to FIG. 7 after the exposed portions of the insulating layer are removed to form air gaps according to one embodiment.

FIG. 8 is a view 800 similar to FIG. 7 after the exposed portions of the insulating layer 102 are removed to form air gaps, such as an air gap 119 between the sidewalls of the conductive features 103 and 104 and an air gap 118 between sidewalls of the conductive features 104 and 105 according to one embodiment. As shown in FIG. 8, the portions 115, 116 and 117 of the etch stop layer 601 are preserved after removal of the exposed portions of the insulating layer 102. In one embodiment, the exposed portions of the insulating layer 102 are removed using one or more selective etching techniques e.g., a dry etching, a wet etching, or both techniques known to one of ordinary skill in the art of electronic device manufacturing.

Figure 9A:
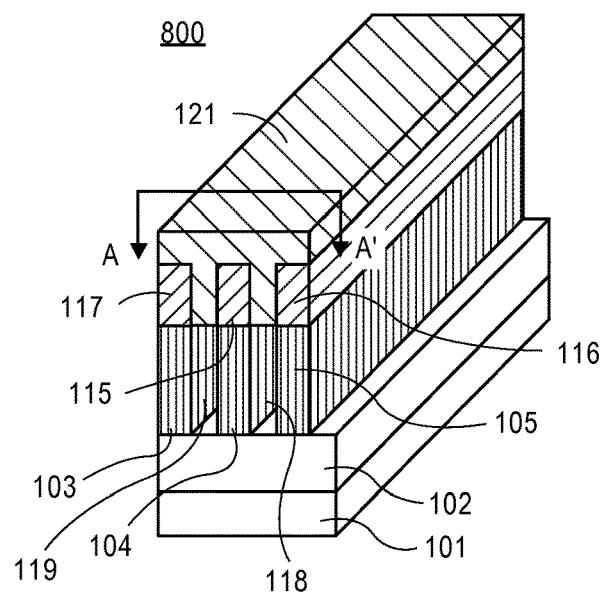
FIG. 9A is a view similar to FIG. 8 after an etch stop layer (ES2) is deposited over an air gap according to one embodiment.
Figure 9B:
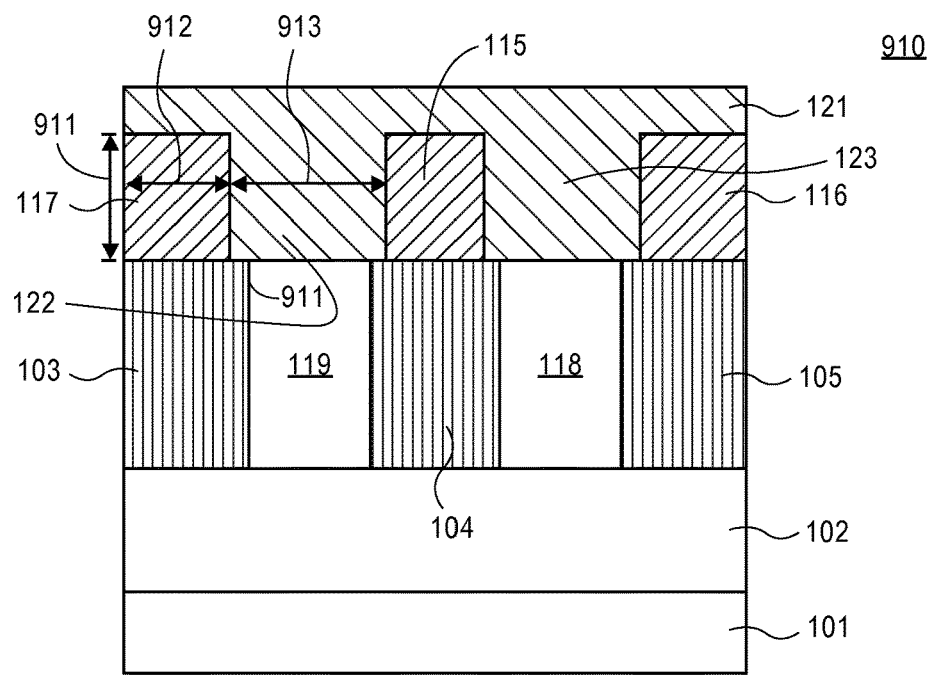
FIG. 9B is a cross-sectional view of the portion of the electronic device depicted in FIG. 9A along an A-A' axis according to one embodiment.

FIG. 9A is a view 900 similar to FIG. 8 after an etch stop layer (ES2) 121 is deposited over an air gap according to one embodiment. FIG. 9B is a cross-sectional view 910 of the portion of the electronic device depicted in FIG. 9A along an A-A' axis according to one embodiment. As shown in FIGS. 9A and 9B, etch stop layer 121 acts as an encapsulating layer for the air gaps 119 and 118. In one embodiment, etch stop layer 121 is deposited onto the "exposed portion of the insulating layer I 02 adjacent to the opposing sidewall of the conductive feature 105 outside of air gap 118. In one embodiment, etch stop layer 121 and etch stop layer 601 are etch selective relative to each other. In one embodiment, etch stop layer 121 is different from etch stop layer 601. In one embodiment, the ratio between the etching rate of the etch stop layer 601 to the etching rate of the etch stop layer 121 is at least 8: 1. As shown in FIG. 9B, the widths of the portions of the etch stop layer 601 are smaller than the widths of the underlying conductive features. In one embodiment, a width 912 of the portion 117 of the etch stop layer 601 is from about 20 percent to about 30 percent smaller than the width of the conductive feature 103. As shown in FIG. 8, portions of the conductive features underneath the portions of the etch stop layer 601, such as a portion 911 are exposed. In one embodiment, the width of the exposed portion 911 of the conductive feature is about one sixth of the width of the conductive feature 103. A portion 122 of etch stop layer 121 is deposited onto the exposed portion 911 of the conductive feature 103 and onto the exposed portion of the conductive feature 104 to bridge over the air gap 119. A portion 123 of etch stop layer 121 is deposited onto other exposed portion of the conductive feature 104 and onto the exposed portion of the conductive feature 105 to bridge over the air gap 118, as shown in FIG. 98. In one embodiment, the thickness 911 of the etch stop layer 601 is from about 2 nm to about 20 nm. In one embodiment, the etch stop layer 121 is thick enough to still remain after the etch stop layer 601 is etched. In one embodiment, the etch stop layer 121 is at least as thick as the etch stop layer 601.

In one embodiment, etch stop layer 121 comprises metallic nanoparticles. In one embodiment, etch stop layer 121 is a nanoparticle (e.g., hafnium, zirconium, other metallic nanoparticle, or a combination thereof) spin on material. In one embodiment, nanoparticles of the etch stop layer 121 are metal oxides, e.g., hafnium oxide, zirconium oxide, other metal oxide, or any combination thereof. In one embodiment, the metal oxide core of the nanoparticle of the etch stop layer 121 is surrounded by carboxylate ligands, which are susceptible to dissociation from the core, which leads to particle aggregation. The nanoparticle aggregates are too large to fit in the trenches (air gaps) between the conductive features that leads to encapsulation of the air gaps.

In one embodiment, depositing the ES2 layer 121 involves spinning on the etch stop layer onto the portions of the ES 1 layer to encapsulate the air gaps. In one embodiment, ES2 layer 121 is baked at a temperature of about 250 degrees C. to encapsulate the air gaps. In more specific embodiment, ES2 layer 121 is baked at a temperature of about 250 degrees C. to aggregate the nanoparticles. The baked ES2 layer is then spun on the ES 1 portions to encapsulate the air gaps. In one embodiment, the size of the aggregated metallic nanoparticles is similar to or greater than a distance between the conductive features, so the aggregated nanoparticles are deposited over" the air gaps, and not within the air gaps. In one embodiment, the size of each nanoparticle of the etch stop layer 201 is from about 1 nm to about 2 nm. In one embodiment, the size of the aggregated nanoparticles is from about 15 nm to about 25 nm.

FIG. 18A shows an image 1800 of a portion of an electronic device 1801 similar to FIG. 8 before depositing a nanoparticle material etch stop layer according to one embodiment. FIG. 18B is an image 1810 similar to FIG. 18A after baking and spinning on a nanoparticle material etch stop layer 1802 on the portion of the electronic device 1801 according to one embodiment. As shown in FIG. 18B, the baked spin on metallic nanoparticle material 1802 naturally encapsulates air gaps, such as air gaps 1803 and 1804. In one embodiment, when the etch stop layer ES2 is deposited to encapsulate the air gap, ES2 does not coat the sidewalls of the metal lines. The deposition of ES2 on the sidewalls of the metal lines can shrink the air gap and the corresponding capacitance benefit may decrease.

Figure 14:
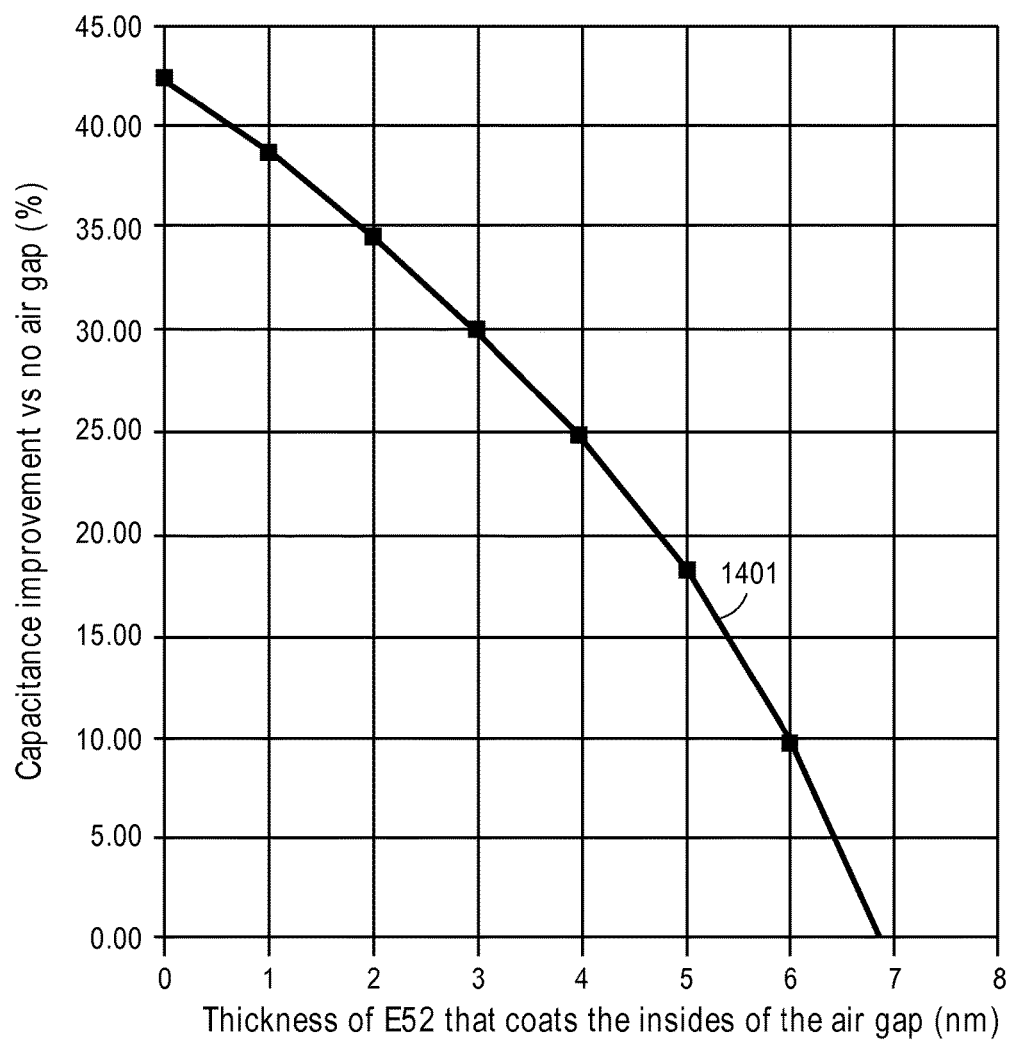
FIG. 14 is a graph showing a capacitance improvement versus a thickness of the etch stop layer ES2 according to one embodiment.

FIG. 14 is a trend graph 1400 showing a capacitance improvement versus a thickness of the etch stop layer ES2 that coats inside of the air gap (e.g., the sidewalls of the metal lines) according to one embodiment. As shown in FIG. 14 if there is no deposition of ES2 between on the sidewall of the metal lines there is from about 40% to about 45% capacitance benefit. If the thickness of the ES2 inside the air gap is about 7 nm, there is about 0% capacitance benefit. In one embodiment, the thickness of the ES 2 layer inside the air gap is less than 3 nm.

Figure 16:
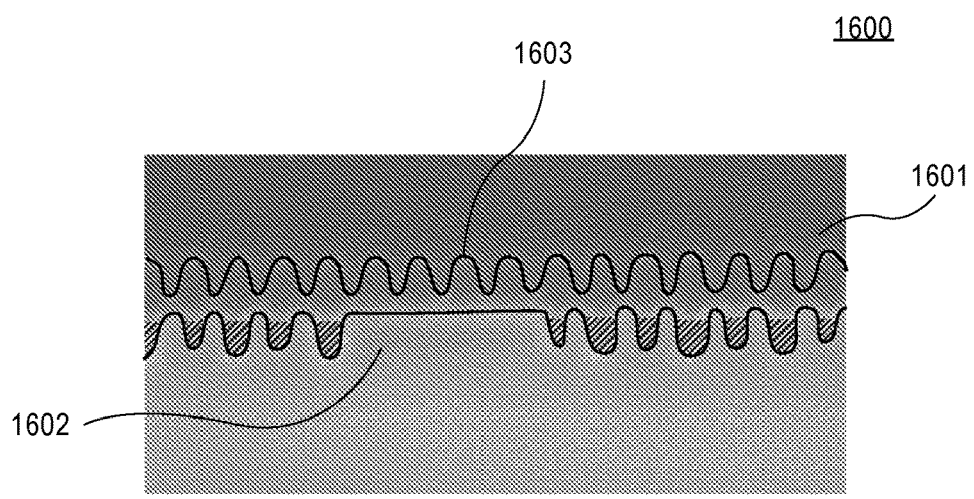
FIG. 16 shows an image of a portion of the electronic device after selectively removing the portions of the PMMA component of the DSA material according to another embodiment.

FIG. 16 shows an image 1600 of a portion of the electronic device after selectively removing the portions of the PMMA component of the DSA material according to another embodiment. FIG. 16 is different from FIG. 15 in that the portion of the electronic device has a wide ILD space 1602. In this case, a PS component of the DSA material 1601 maintains the pitch over a wide ILD space 1602, as shown in FIG. 16. In one embodiment, for the wide ILD space 1602, an air gap is etched between portions of the ILD instead of the conductive features. In one embodiment, the air gap etched between the ILD portions is deeper comparing to the air gap etched between the conductive features. In one embodiment, in wide ILD space 1602 in the scribe line the DSA material forms a pattern 1603 that looks like a fingerprint. In one embodiment, in the scribe line, after the air gap etch, a fingerprint pattern of the air gaps alternating with the portions of the ILD is formed.

Figure 10A:
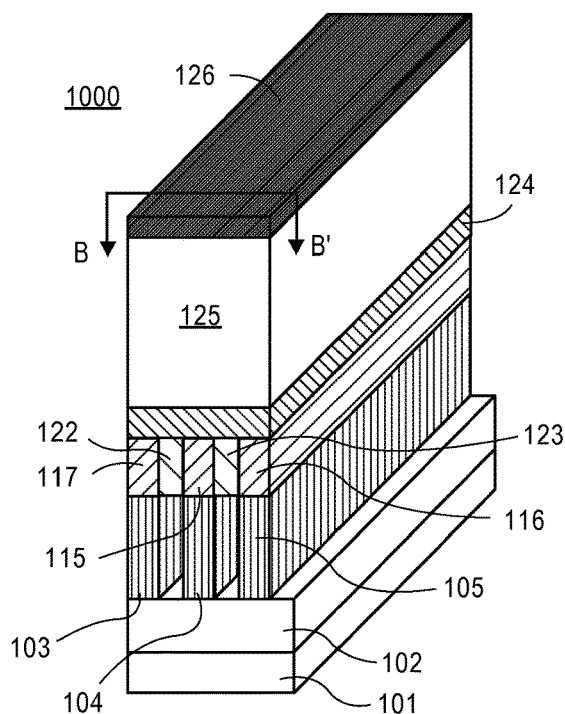
FIG. 10A is a view similar to FIG. 9A after the etch stop layer ES2 is recessed, a hermetic etch stop layer, an insulating layer 125, and a hard mask layer are deposited to form a next interconnect layer according to one embodiment.
Figure 10B:
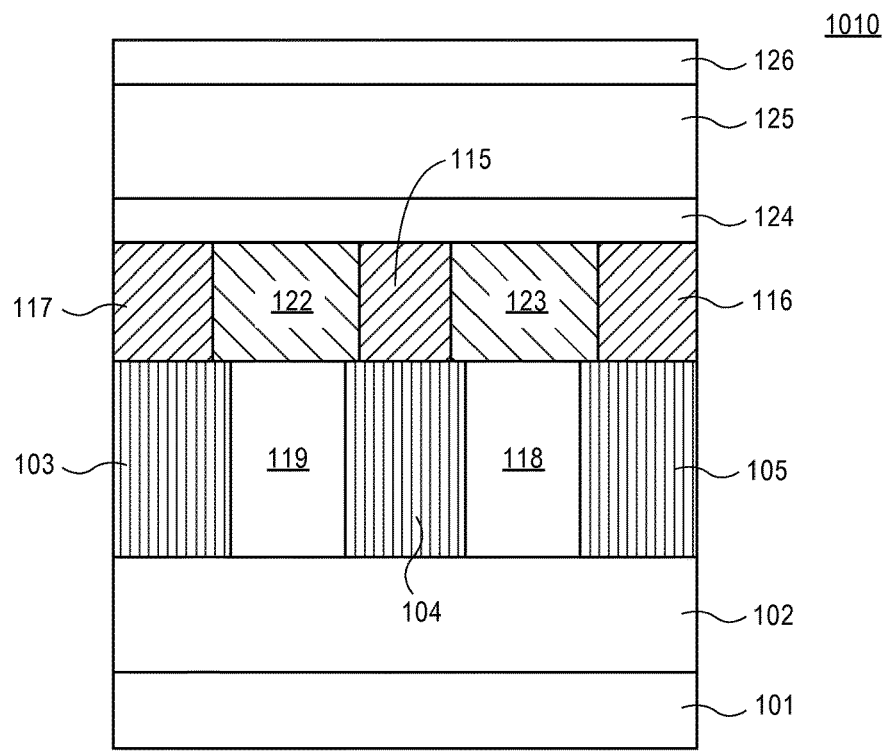
FIG. 10B is a cross sectional view of the portion of the electronic device depicted in FIG. 10A along a B-B' axis according to one embodiment.

FIG. 10A is a view 1000 similar to FIG. 9A after the etch stop layer 121 is recessed, a hermetic etch stop layer 124 is deposited on the recessed portions of the etch stop layer 121, an insulating layer 125 is deposited on the etch stop layer 124, and a hard mask layer 126 is deposited to form a next interconnect layer according to one embodiment. FIG. 10B is a cross sectional view 1010 of the portion of the electronic device depicted in FIG. 10A along a B-B' axis according to one embodiment. As shown in FIGS. 10A and 10B, the etch stop layer 121 is recessed to remove overburden excess portions of the etch stop layer and to expose portions 117, 115 and 116 of the etch stop layer 601. In one embodiment, the etch stop layer 121 is recessed using one of the CMP techniques known to one of ordinary skill in the art of electronic device manufacturing. In one embodiment, the etch stop layer 121 is recessed using one or more of wet etching, dry etching, or a combination thereof techniques known to one of ordinary skill in the art of electronic device manufacturing. As shown in FIGS. 10A and 10B, two different etch stop layer portions ES1 and ES2 are deposited over the conductive features 103, 104 and 105. In one embodiment, ES2 material above the air gaps 118 and 119 is harder to etch than the ES1 material to prevent unlanded vias from punching through the underlying interconnect layer, as described in further detail below. As shown in FIGS. 10A and 10B, hermetic etch stop layer 124 is deposited on the recessed portions 122 and 123 of the etch stop layer 121 and onto the portions 117, 115 and 116 of the etch stop layer 601 to protect the underlying conductive features from humidity.

In one embodiment, the etch stop layer 124 is a silicon nitride layer, a silicon carbide layer, a silicon carbide nitride layer, a silicon carbide oxide layer, a silicon carbide nitride hydrogen layer, or a combination thereof. In one embodiment, etch stop layer 124 comprises silicon (Si), carbon (C), nitrogen (N), oxygen (O), hydrogen (H), or any combination thereof. In one embodiment, etch stop layer 124 is a carbon doped silicon nitride (SiN:C) layer. In one embodiment, etch stop layer 124 is a carbon doped silicon oxide nitride (SiON:C) layer. In one embodiment, etch stop layer 124 is a high-k dielectric layer having a dielectric constant k greater than that of silicon oxide.

In alternate embodiments, etch stop layer 124 is an oxide layer, e.g., a silicon oxide layer, a carbon doped silicon oxide, a fluorine-doped silicon oxide, a metal oxide, e.g., a titanium oxide, an aluminum oxide, or any other metal oxide; a hydrogensilesquioxane, a fluorine-doped silicon oxide, a fluorinated amorphous carbon, a methylsesquioxane (MSQ), a nitride layer, e.g., a silicon nitride, a titanium nitride, a silicon oxide nitride, silicon carbide, or other etch stop layer. In one embodiment, the thickness of the etch stop layer 124 is from about 2 nm to about 20 nm.

In an embodiment, etch stop layer 124 is deposited using one of deposition techniques, such as but not limited to a blanket deposition, a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of microelectronic device manufacturing.

In one embodiment, insulating layer 125 is an interlayer dielectric (ILD) layer. In one embodiment, insulating layer 125 is an oxide layer, e.g., a silicon oxide layer. In one embodiment, insulating layer 125 is a low-k dielectric, e.g., silicon dioxide, silicon oxide, carbon doped oxide ("CDO"), or any combination thereof. In one embodiment, insulating layer 125 includes a nitride, oxide, a polymer, phosphosilicate glass, fluorosilicate ("SiOF") glass, organosilicate glass ("SiOCH"), or any combination thereof. In another embodiment, insulating layer 125 is a nitride layer, e.g., silicon nitride layer. In alternative embodiments, insulating layer 125 is an aluminum oxide, silicon oxide nitride, other oxide/nitride layer, any combination thereof, or other electrically insulating layer determined by an electronic device design.

In one embodiment, the thickness of the insulating layer 125 is determined by design. In one embodiment, the insulating layer 125 is deposited to the thickness from about 50 nanometers (nm) to about 2 microns (µm). In an embodiment, insulating layer 125 is deposited on substrate 101 using one of deposition techniques, such as but not limited to a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing.

In one embodiment, hard mask layer 126 is a nitride layer, e.g., a silicon nitride, a silicon oxide nitride, a carbon layer, other hard mask layer, or any combination thereof. The mask layer 126 can be deposited using one of the hard mask layer deposition techniques known to one of ordinary skill in the art of electronic device manufacturing.

Figure 11:
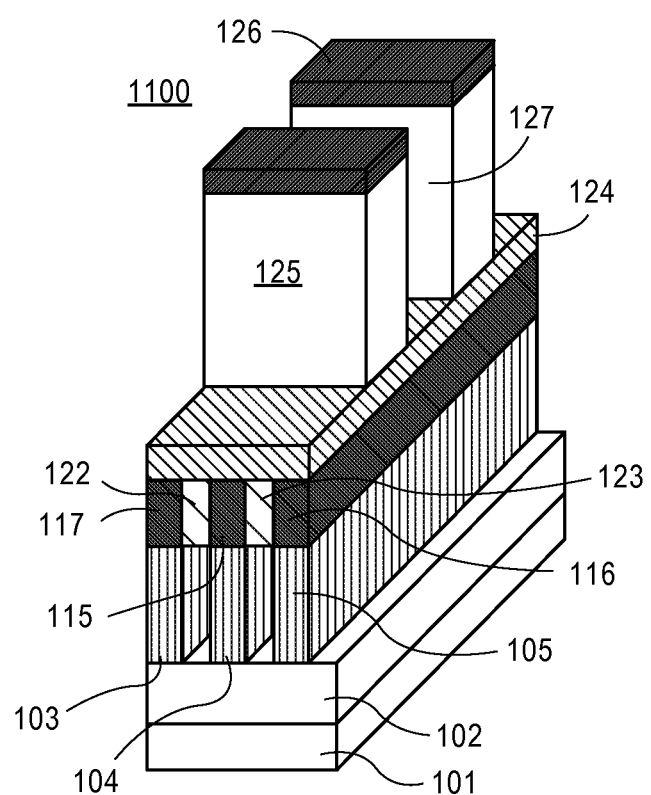
FIG. 11 is a view similar to FIG. 10A after the hard mask layer is patterned and the insulating layer is etched to form one or more trenches according to one embodiment.

FIG. 11 is a view 1100 similar to FIG. 10A after the hard mask layer 126 is patterned and the insulating layer 125 is etched through the patterned hard mask layer to form one or more trenches according to one embodiment. The hard mask layer 126 can be patterned using one of the hard mask layer patterning techniques known to one of ordinary skill in the art of electronic device manufacturing. As shown in FIG. 11, the portions of the insulating layer 125 are etch down to expose portions of the hermetic etch stop layer 124. As shown in FIG. 11, a trench 127 is formed in insulating layer 125. In one embodiment, the insulating layer 125 is etched using one or more of wet etching, dry etching, or a combination thereof techniques known to one of ordinary skill in the art of electronic device manufacturing.

Figure 12A:
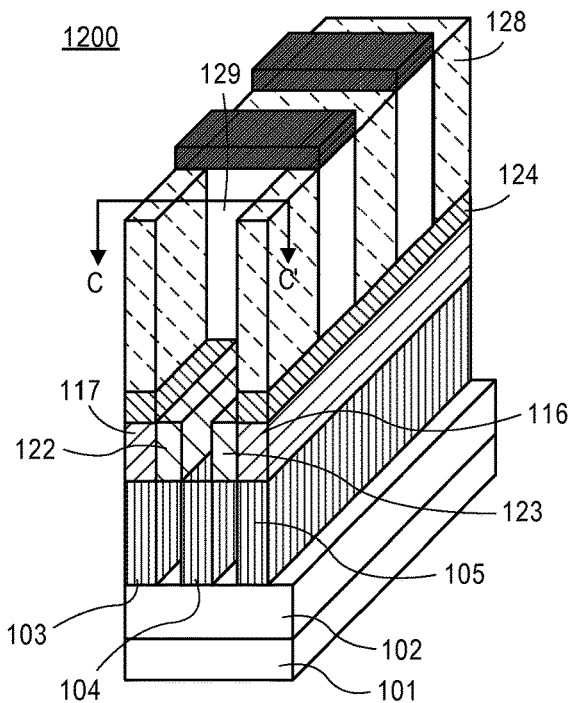
FIG. 12A is a view similar to FIG. 11 after patterning and etching the insulating layer to form a via according to one embodiment.
Figure 12B:
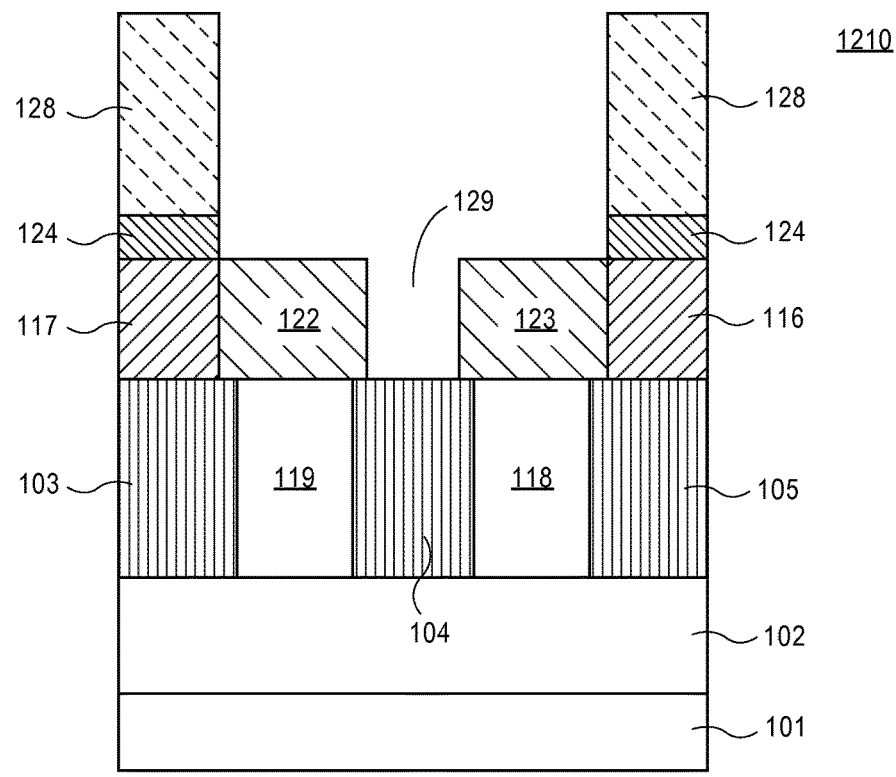
FIG. 12B is a cross-sectional view of the portion of the electronic device depicted in FIG. 12A along a C-C' axis according to one embodiment.

FIG. 12A is a view 1200 similar to FIG. 11 after patterning and etching the insulating layer 125 to form a via according to one embodiment. FIG. 12B is a cross-sectional view 1210 of the portion of the electronic device depicted in FIG. 12A along a C-C' axis according to one embodiment. As shown in FIGS. 12A and 12B, a patterned hard mask layer 128 comprising one or more hard mask layers is deposited onto the exposed portions of the etch stop layer 124 and into trench 127. In one embodiment, hard mask layer 128 is a nitride layer, e.g., a silicon nitride, a silicon oxide nitride, a carbon layer, other hard mask layer, or any combination thereof. The mask layer 128 can be deposited and patterned using one of the hard mask layer deposition and patterning techniques known to one of ordinary skill in the art of electronic device manufacturing. A via opening 129 is etched selectively through the patterned hard mask layer 128, etch stop layer 124 and ES1 layer down to conductive feature 104, as shown in FIGS. 12A and 12B. As shown in FIGS. 12A and 12B portions 122 and 123 of the ES2 layer remain above the air gaps 119 and 118 during the etching of the via opening. In one embodiment, via opening 129 is etched selectively to ES2 layer using one or more of selective wet etching, selective dry etching, or a combination thereof techniques known to one of ordinary skill in the art of electronic device manufacturing.

Figure 13A:
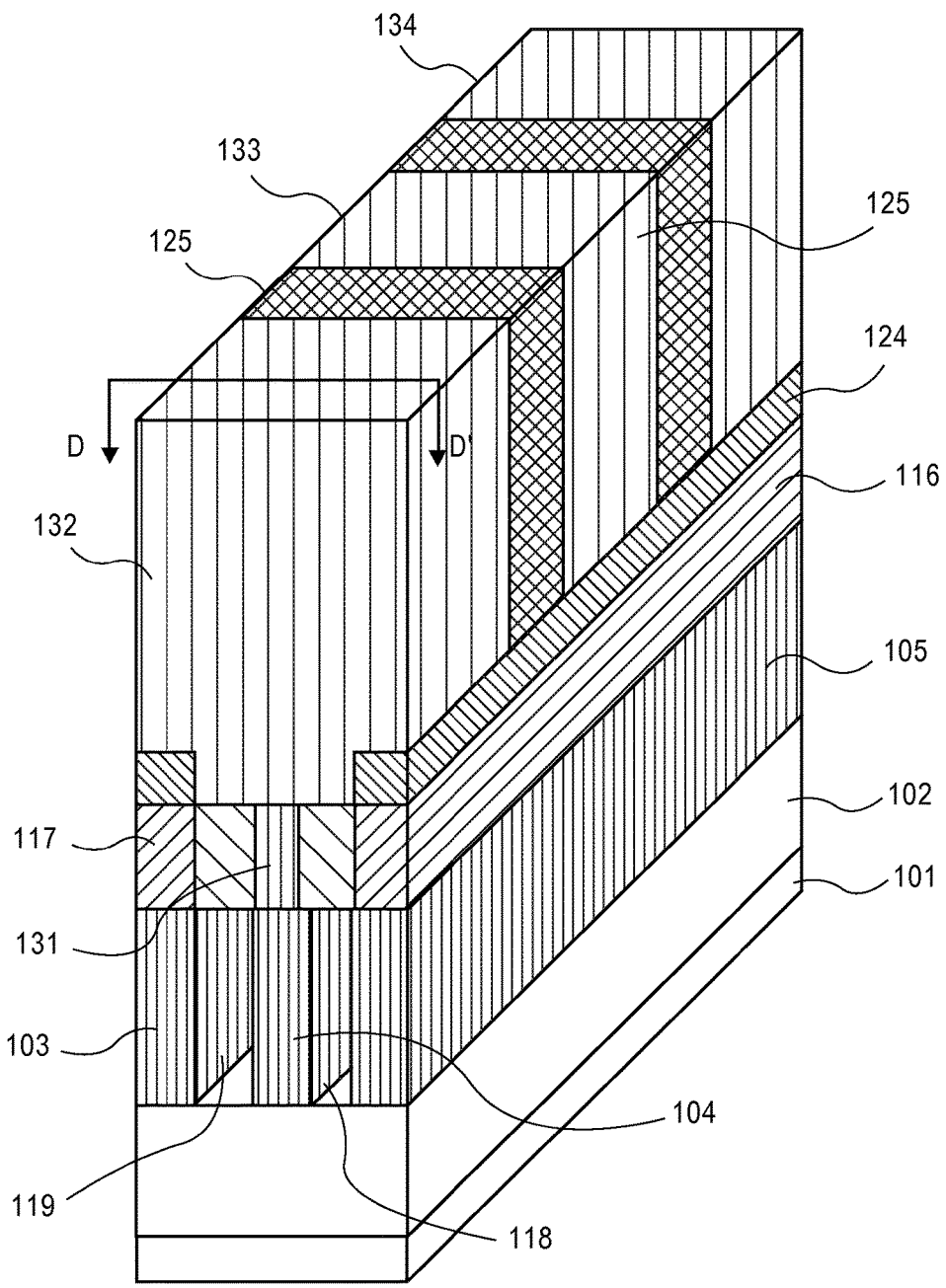
FIG. 13A is a view similar to FIG. 12A after the hard mask layers are removed and a conductive layer is deposited according to one embodiment.
Figure 13B:
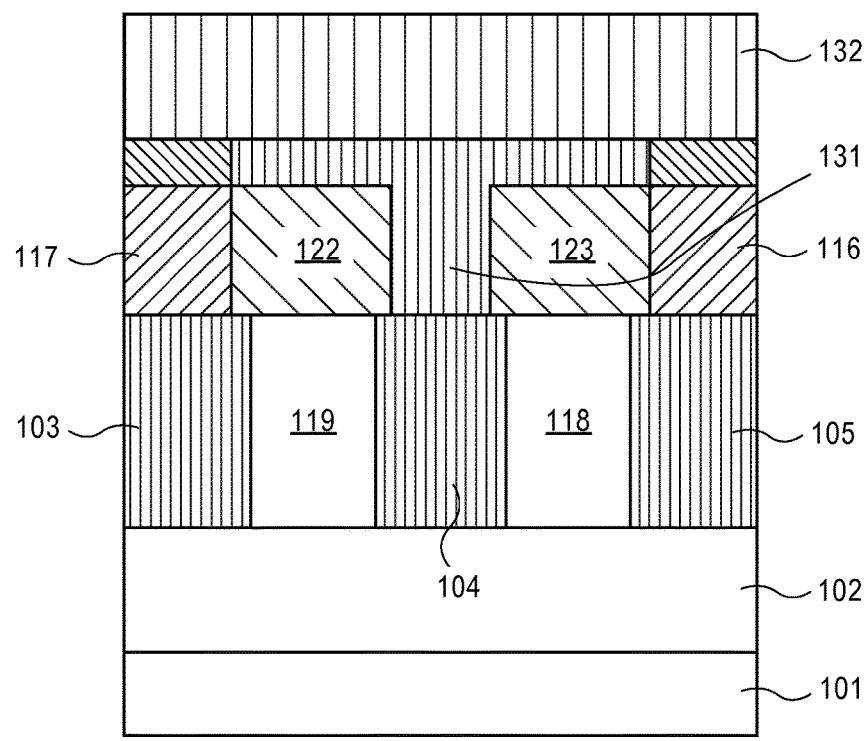
FIG. 13B is a cross sectional view of the portion of the electronic device depicted in FIG. 13A along a D-D' axis according to one embodiment.

FIG. 13A is a view 1300 similar to FIG. 12A after the hard mask layers 126 and 128 are removed and a conductive layer 132 is deposited onto the exposed portions of the etch stop layer 124 filling trench 127 to form conductive features 133 and 134 and a conductive via 131 according to one embodiment. FIG. 13B is a cross sectional view 1310 of the portion of the electronic device depicted in FIG. 13A along a D-D' axis according to one embodiment. In one embodiment, hard mask layers 126 and 128 are removed using one or more of the hard mask layer removal techniques known to one of ordinary skill in the art of electronic device manufacturing. In one embodiment, hard mask layers 126 and 128 are removed using an ashing technique. As shown in FIGS. 13A and 13B, conductive via 131 lands on the undelying conductive feature 104 without punching through the air gaps 119 and 118.

In one embodiment, the conductive layer 132 is deposited using one of conductive layer deposition techniques known to one of ordinary skill in the art of semiconductor manufacturing, e.g., electroplating, electroless plating, or other conductive layer deposition techniques. In one embodiment, conductive layer 132 includes e.g., copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof.

In alternative embodiments, examples of the conductive materials that may be used for the conductive layer 132 include, but are not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

Figure 19:
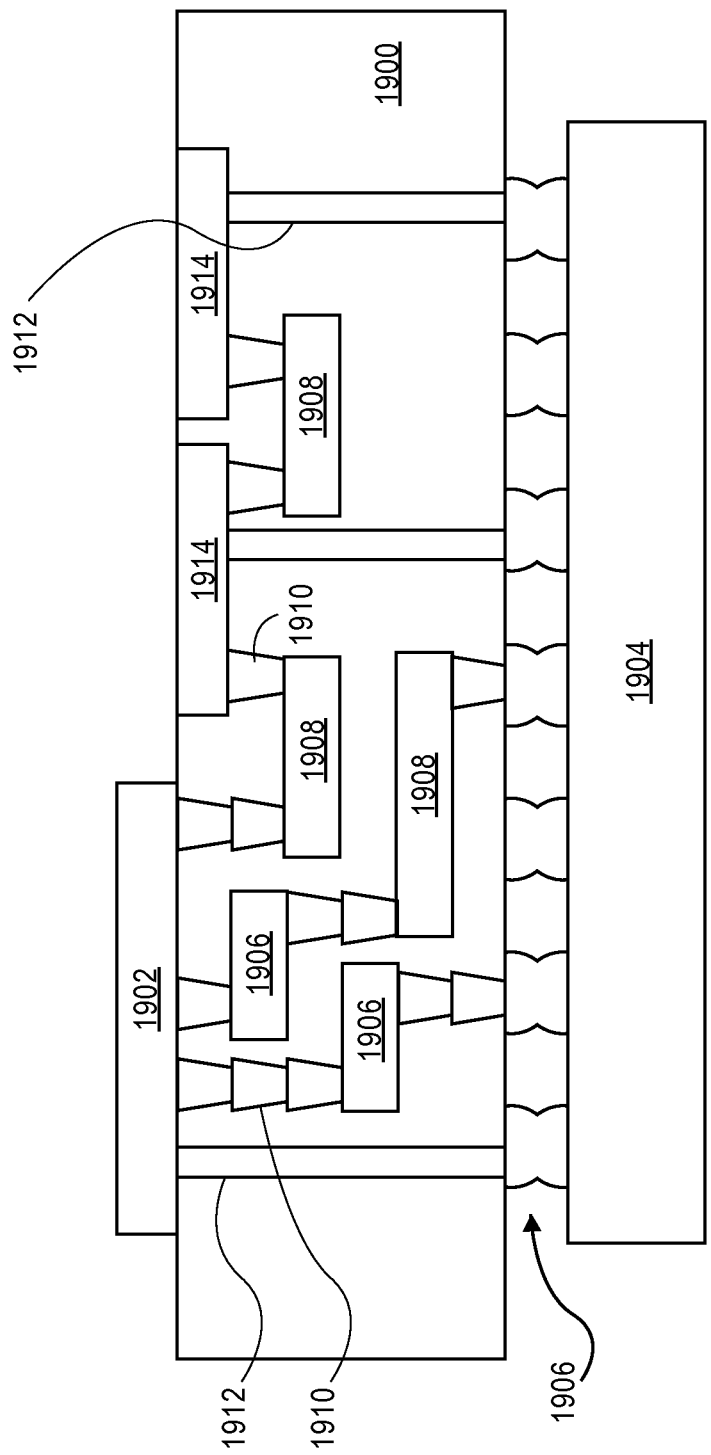
FIG. 19 illustrates an interposer that includes one or more embodiments of the invention.

FIG. 19 illustrates an interposer 1900 that includes one or more embodiments of the invention. The interposer 1900 is an intervening substrate used to bridge a first substrate 1902 to a second substrate 1904. The first substrate 1902 may be, for instance, an integrated circuit die. The second substrate 1904 may be, for instance, a memory module, a computer motherboard, or another integrated circuit die. Generally, the purpose of an interposer 1900 is to spread a connection to a wider pitch or to reroute a connection to a different connection. For example, an interposer 1900 may couple an integrated circuit die to a ball grid array (BGA) 1906 that can subsequently be coupled to the second substrate 1904. In some embodiments, the first and second substrates 1902/1904 are attached to opposing sides of the interposer 1900. In other embodiments, the first and second substrates 1902/1904 are attached to the same side of the interposer 1900. And in further embodiments, three or more substrates are interconnected by way of the interposer 1900.

The interposer 1900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1908, vias 1910, including but not limited to through-silicon vias (TSVs) 1912 and one or more maskless air gaps to prevent a via punch through as described above. The interposer 1900 may further include embedded devices 1914, including passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1900. In accordance with embodiments of the invention, apparatuses or processes disclosed herein may be used in the fabrication of interposer 1900.

Figure 20:
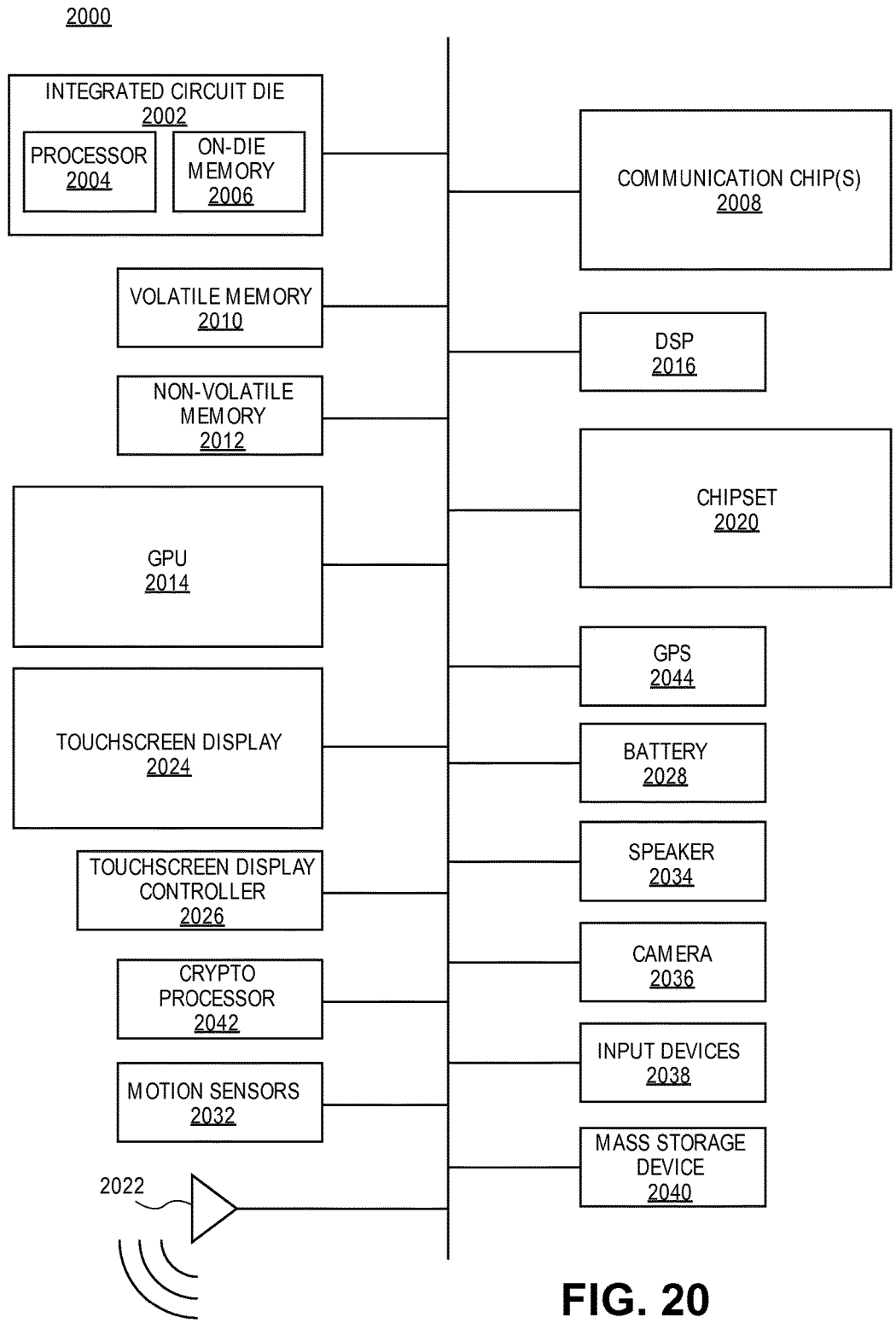
FIG. 20 illustrates a computing device in accordance with one embodiment of the invention.

FIG. 20 illustrates a computing device 2000 in accordance with one embodiment of the invention. The computing device 2000 may include a number of components. In one embodiment, these components are attached to one or more motherboards. In an alternate embodiment, these components are fabricated onto a single system-on-a-chip (SoC) die rather than a motherboard. The components in the computing device 2000 include, but are not limited to, an integrated circuit die 2002 and at least one communication chip 2008. In some implementations the communication chip 2008 is fabricated as part of the integrated circuit die 2002. The integrated circuit die 2002 may include a processor 2004 such as a central processing unit (CPU), an on-die memory 2006, often used as cache memory, that can be provided by technologies such as embedded DRAM (eDRAM) or spin-transfer torque memory (STTM or STTM-RAM).

Computing device 2000 may include other components that may or may not be physically and electrically coupled to the motherboard or fabricated within an SoC die. These other components include, but are not limited to, a volatile memory 2010 (e.g., DRAM), a non-volatile memory 2012 (e.g., ROM or flash memory), a graphics processing unit 2014 (GPU), a digital signal processor 2016 (DSP), a crypto processor 2042 (a specialized processor that executes cryptographic algorithms within hardware), a chipset 2020, an antenna 2022, a display or a touchscreen display 2024, a touchscreen display controller 2026, a battery 2028 or other power source, a global positioning system (GPS) device 2044, a power amplifier (PA), a compass, a motion coprocessor or sensors 2032 (that may include an accelerometer, a gyroscope, and a compass), a speaker 2034, a camera 2036, user input devices 2038 (such as a keyboard, mouse, stylus, and touchpad), and a mass storage device 2040 (such as hard disk drive, compact disk (CD), digital versatile disk (DVD), and so forth).

The communication chip 2008 enables wireless communications for the transfer of data to and from the computing device 2000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2008 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 2000 may include a plurality of communication chips 2008. For instance, a first communication chip 2008 may be dedicated to shorter range wireless communications such as Wi-Fi and Bluetooth and a second communication chip 2008 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. One or more components e.g., integrated circuit die 2002, communication chip 2008, GPU 2014, cryptoprocessor 2042, DSP 2016, chipset 2020, and other components may include one or more maskless air gaps and vias formed in accordance with embodiments of the invention. In further embodiments, another component housed within the computing device 2000 may contain one or more maskless air gaps and vias formed in accordance with embodiments of the invention.

In various embodiments, the computing device 2000 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 2000 may be any other electronic device that processes data.

The above description of illustrated implementations of the invention, including what is described in the Abstract, is not intended to be exhaustive or to limit the invention to the precise forms disclosed. While specific implementations of, and examples for the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The following examples pertain to further embodiments:

In one embodiment, a method to manufacture an electronic device comprises depositing a first etch stop layer on a plurality of conductive features on an insulating layer on a substrate; depositing a second etch stop layer over an air gap between the conductive features; and etching the first etch stop layer to form a via to at least one of the conductive features.

In one embodiment, a method to manufacture an electronic device comprises depositing a first sacrificial layer on a plurality of conductive features on an insulating layer on a substrate, wherein a first material of the first sacrificial layer is deposited on first portions of the insulating layer between the conductive features and a second material layer of the first sacrificial layer is deposited on the plurality of conductive features; removing the second material layer to expose portions of the conductive features; depositing a first etch stop layer on the exposed portions of the plurality of conductive features; depositing a second etch stop layer over an air gap between the conductive features; and etching the first etch stop layer to form a via to at least one of the conductive features.

In one embodiment, a method to manufacture an electronic device comprises depositing a first sacrificial layer on a plurality of conductive features on an insulating layer on a substrate, wherein a first material of the first sacrificial layer is deposited on first portions of the insulating layer between the conductive features and a second material layer of the first sacrificial layer is deposited on the plurality of conductive features; removing the first material layer to expose the first portions of the insulating layer; depositing a second sacrificial layer on the exposed first portions of the insulating layer; removing the second material layer to expose portions of the conductive features; depositing a first etch stop layer on the exposed portions of the plurality of conductive features; depositing a second etch stop layer over an air gap between the conductive features; and etching the first etch stop layer to form a via to at least one of the conductive features.

In one embodiment, a method to manufacture an electronic device comprises depositing a first sacrificial layer on a plurality of conductive features on an insulating layer on a substrate, wherein a first material of the first sacrificial layer is deposited on first portions of the insulating layer between the conductive features and a second material layer of the first sacrificial layer is deposited on the plurality of conductive features, wherein the first material comprises a polymethyl methacrylate (PMMA) material and the second material comprises a polystyrene (PS) material; removing the second material layer to expose portions of the conductive features; depositing a first etch stop layer on the exposed portions of the plurality of conductive features; depositing a second etch stop layer over an air gap between the conductive features; and etching the first etch stop layer to form a via to at least one of the conductive features.

In one embodiment, a method to manufacture an electronic device comprises depositing a first etch stop layer on a plurality of conductive features on an insulating layer on a substrate; depositing a second etch stop layer over an air gap between the conductive features; and etching the first etch stop layer to form a via to at least one of the conductive features, wherein the second etch stop material is baked to encapsulate the air gap.

In one embodiment, a method to manufacture an electronic device comprises depositing a first etch stop layer on a plurality of conductive features on an insulating layer on a substrate; etching the insulating layer to form an air gap between the conductive features; depositing a second etch stop layer over the air gap; and etching the first etch stop layer to form a via to at least one of the conductive features.

In one embodiment, a method to manufacture an electronic device comprises depositing a first etch stop layer on a plurality of conductive features on an insulating layer on a substrate; depositing a second etch stop layer over an air gap between the conductive features; and etching the first etch stop layer to form a via to at least one of the conductive features, wherein the first etch stop layer and the second etch stop layer are etch selective relative to each other.

In one embodiment, a method to manufacture an electronic device comprises depositing a first etch stop layer on a plurality of conductive features on an insulating layer on a substrate; depositing a second etch stop layer over an air gap between the conductive features; and etching the first etch stop layer to form a via to at least one of the conductive features, wherein the first etch stop layer comprises a fillable nitride.

In one embodiment, a method to manufacture an electronic device comprises depositing a first etch stop layer on a plurality of conductive features on an insulating layer on a substrate; depositing a second etch stop layer over an air gap between the conductive features; and etching the first etch stop layer to form a via to at least one of the conductive features, wherein the second etch stop layer comprises metallic nanoparticles.

In one embodiment, a method to manufacture an electronic device comprises depositing a first etch stop layer on a plurality of conductive features on an insulating layer on a substrate; depositing a second etch stop layer over an air gap between the conductive features; recessing the second etch stop layer; depositing a third etch stop layer on the recessed second etch stop layer; depositing an interconnect layer on the third etch stop layer; etching the first etch stop layer; and forming a via in the interconnect layer to at least one of the conductive features.

In one embodiment, a method to provide a maskless air gap process comprises curing a first sacrificial layer on a plurality of conductive features on an insulating layer on a substrate to align a first material of the first sacrificial layer to first portions of the insulating layer between the conductive features and to align a second material of the first sacrificial layer to the plurality of conductive features; etching the first material to expose the first portions of the insulating layer; depositing a second sacrificial layer onto the exposed first portions of the insulating layer; removing the second material layer to expose portions of the conductive features; depositing a first etch stop layer one the exposed portions of the conductive features; and forming an air gap between at least two of the conductive features.

In one embodiment, a method to provide a maskless air gap process comprises curing a first sacrificial layer on a plurality of conductive features on an insulating layer on a substrate to align a first material of the first sacrificial layer to first portions of the insulating layer between the conductive features and to align a second material of the first sacrificial layer to the plurality of conductive features; etching the first material to expose the first portions of the insulating layer; depositing a second sacrificial layer onto the exposed first portions of the insulating layer; removing the second material layer to expose portions of the conductive features; depositing a first etch stop layer one the exposed portions of the conductive features; and forming an air gap between at least two of the conductive features; depositing a second etch stop layer over the air gap, wherein the second etch stop layer is different from the first etch stop layer.

In one embodiment, a method to provide a maskless air gap process comprises curing a first sacrificial layer on a plurality of conductive features on an insulating layer on a substrate to align a first material of the first sacrificial layer to first portions of the insulating layer between the conductive features and to align a second material of the first sacrificial layer to the plurality of conductive features; etching the first material to expose the first portions of the insulating layer; depositing a second sacrificial layer onto the exposed first portions of the insulating layer; removing the second material layer to expose portions of the conductive features; depositing a first etch stop layer one the exposed portions of the conductive features; forming an air gap between at least two of the conductive features; depositing a third etch stop layer on the first etch stop layer; depositing an interconnect layer on the third etch stop layer; and forming a via in the interconnect layer.

In one embodiment, a method to provide a maskless air gap process comprises curing a first sacrificial layer on a plurality of conductive features on an insulating layer on a substrate to align a first material of the first sacrificial layer to first portions of the insulating layer between the conductive features and to align a second material of the first sacrificial layer to the plurality of conductive features, wherein the first material comprises a polymethyl methacrylate (PMMA) material; etching the first material to expose the first portions of the insulating layer; depositing a second sacrificial layer onto the exposed first portions of the insulating layer; removing the second material layer to expose portions of the conductive features; depositing a first etch stop layer one the exposed portions of the conductive features; and forming an air gap between at least two of the conductive features.

In one embodiment, a method to provide a maskless air gap process comprises curing a first sacrificial layer on a plurality of conductive features on an insulating layer on a substrate to align a first material of the first sacrificial layer to first portions of the insulating layer between the conductive features and to align a second material of the first sacrificial layer to the plurality of conductive features, wherein the second material comprises a polystyrene (PS) material; etching the first material to expose the first portions of the insulating layer; depositing a second sacrificial layer onto the exposed first portions of the insulating layer; removing the second material layer to expose portions of the conductive features; depositing a first etch stop layer one the exposed portions of the conductive features; and forming an air gap between at least two of the conductive features.

In one embodiment, a method to provide a maskless air gap process comprises curing a first sacrificial layer on a plurality of conductive features on an insulating layer on a substrate to align a first material of the first sacrificial layer to first portions of the insulating layer between the conductive features and to align a second material of the first sacrificial layer to the plurality of conductive features, wherein the first sacrificial layer is a directed self assembly (DSA) material; etching the first material to expose the first portions of the insulating layer; depositing a second sacrificial layer onto the exposed first portions of the insulating layer; removing the second material layer to expose portions of the conductive features; depositing a first etch stop layer one the exposed portions of the conductive features; and forming an air gap between at least two of the conductive features.

In one embodiment, a method to provide a maskless air gap process comprises curing a first sacrificial layer on a plurality of conductive features on an insulating layer on a substrate to align a first material of the first sacrificial layer to first portions of the insulating layer between the conductive features and to align a second material of the first sacrificial layer to the plurality of conductive features; etching the first material to expose the first portions of the insulating layer; depositing a second sacrificial layer onto the exposed first portions of the insulating layer; removing the second material layer to expose portions of the conductive features; depositing a first etch stop layer one the exposed portions of the conductive features, wherein the first etch stop layer comprises a fillable nitride; and forming an air gap between at least two of the conductive features.

In one embodiment, a method to provide a maskless air gap process comprises curing a first sacrificial layer on a plurality of conductive features on an insulating layer on a substrate to align a first material of the first sacrificial layer to first portions of the insulating layer between the conductive features and to align a second material of the first sacrificial layer to the plurality of conductive features; etching the first material to expose the first portions of the insulating layer; depositing a second sacrificial layer onto the exposed first portions of the insulating layer, wherein the second sacrificial layer comprises a silicon containing polymer; removing the second material layer to expose portions of the conductive features; depositing a first etch stop layer one the exposed portions of the conductive features; and forming an air gap between at least two of the conductive features.

In one embodiment, an electronic device comprises a first etch stop layer on a plurality of conductive features on an insulating layer on a substrate; a second etch stop layer over an air gap between the conductive features; and a via adjacent to the second etch stop layer to contact at least one of the conductive features.

In one embodiment, an electronic device comprises a first etch stop layer on a plurality of conductive features on an insulating layer on a substrate; a second etch stop layer over an air gap between the conductive features, wherein the first etch stop layer and the second etch stop layer are etch selective relative to each other; and a via adjacent to the second etch stop layer to contact at least one of the conductive features.

In one embodiment, an electronic device comprises a first etch stop layer on a plurality of conductive features on an insulating layer on a substrate, wherein the first etch stop layer comprises a fillable nitride; a second etch stop layer over an air gap between the conductive features; and a via adjacent to the second etch stop layer to contact at least one of the conductive features.

In one embodiment, an electronic device comprises a first etch stop layer on a plurality of conductive features on an insulating layer on a substrate; a second etch stop layer over an air gap between the conductive features, wherein the second etch stop layer comprises metallic nanoparticles; and a via adjacent to the second etch stop layer to contact at least one of the conductive features.

In one embodiment, an electronic device comprises a first etch stop layer on a plurality of conductive features on an insulating layer on a substrate; a second etch stop layer over an air gap between the conductive features; a third etch stop layer on at least one of the first etch stop layer and the second etch stop layer; and a via through the third etch stop layer adjacent to the second etch stop layer to contact at least one of the conductive features.

In one embodiment, an electronic device comprises a first etch stop layer on a plurality of conductive features on an insulating layer on a substrate; a second etch stop layer over an air gap between the conductive features; an interconnect layer over at least one of the first etch stop layer and the second etch stop layer; and a via in the interconnect layer adjacent to the second etch stop layer to contact at least one of the conductive features.

In one embodiment, an electronic device comprises a first etch stop layer on a plurality of conductive features on an insulating layer on a substrate; a second etch stop layer over an air gap between the conductive features, wherein the second etch stop layer encapsulates the air gap; and a via adjacent to the second etch stop layer to contact at least one of the conductive features.

In one embodiment, an electronic device comprises a first etch stop layer on a plurality of conductive features on an insulating layer on a substrate; a second etch stop layer over an air gap between the conductive features; and a via adjacent to the second etch stop layer to contact at least one of the conductive features, wherein the ratio between the etching rates of the first etch stop layer and the second etch stop layer is at least 8:1.

In the foregoing specification, methods and apparatuses have been described with reference to specific exemplary embodiments thereof. It will be evident that various modifications may be made thereto without departing from the broader spirit and scope of embodiments as set forth in the following claims. The specification and drawings are, accordingly, to be regarded in an illustrative sense rather than a restrictive sense.

What is claimed is:

1. A method to manufacture an electronic device, comprising:
   depositing a first etch stop layer on a top surface of a plurality of conductive features on an insulating layer on a substrate;
   subsequent to depositing the first etch stop layer, depositing a second etch stop layer over an air gap between the plurality of conductive features; and
   etching the first etch stop layer to form a via to at least one of the plurality of conductive features.

2. The method of claim 1, further comprising depositing a first sacrificial layer on the plurality of conductive features, wherein a first material of the first sacrificial layer is deposited on first portions of the insulating layer between respective ones of the plurality of conductive features and a second material layer of the first sacrificial layer is deposited on respective ones of the plurality of conductive features; and
   removing the second material layer to expose portions of respective ones of the plurality of conductive features, wherein the first etch stop layer is deposited on the exposed portions of the plurality of conductive features.

3. The method of claim 1, wherein the second etch stop layer is baked to encapsulate the air gap.

4. The method of claim 1, further comprising etching the insulating layer to form the air gap.

5. The method of claim 1, wherein the first etch stop layer and the second etch stop layer have differing etch characteristics.

6. The method of claim 1, wherein the first etch stop layer comprises a nitride.

7. The method of claim 1, wherein the second etch stop layer comprises metallic nanoparticles.

8. The method of claim 1, further comprising recessing the second etch stop layer;
   depositing a third etch stop layer on the recessed second etch stop layer;
   depositing an interconnect layer on the third etch stop layer; and
   forming a via in the interconnect layer.

9. A method to provide a maskless air gap process, comprising:
   curing a first sacrificial layer on a plurality of conductive features on an insulating layer on a substrate to align a first material of the first sacrificial layer to first portions of the insulating layer between respective ones of the plurality of conductive features and to align a second material of the first sacrificial layer to respective ones of the plurality of conductive features;
   etching the first material to expose the first portions of the insulating layer;
   depositing a second sacrificial layer onto the exposed first portions of the insulating layer;
   removing the second sacrificial layer to expose portions of respective ones of the plurality of conductive features;
   depositing a first etch stop layer on the exposed portions of the plurality of conductive features; and
   forming an air gap between at least two of the plurality of conductive features.

10. The method of claim 9, further comprising depositing a second etch stop layer over the air gap.

11. The method of claim 9, further comprising depositing a third etch stop layer on the first etch stop layer;
    depositing an interconnect layer on the third etch stop layer; and
    forming a via in the interconnect layer.

12. The method of claim 9, wherein the first material comprises a polymethyl methacrylate (PMMA) material, and wherein the second material comprises a polystyrene (PS) material.

13. The method of claim 9, wherein the first etch stop layer comprises a nitride.

14. The method of claim 9, wherein the second sacrificial layer comprises a silicon containing polymer.

15. The method of claim 1, wherein the first etch stop layer and the second etch stop layer have differing etch characteristics.

16. A method to manufacture an electronic device, comprising:
    depositing a first sacrificial layer on a plurality of conductive features on an insulating layer on a substrate, wherein a first material of the first sacrificial layer is deposited on first portions of the insulating layer between respective ones of the plurality of conductive features and a second material layer of the first sacrificial layer is deposited on respective ones of the plurality of conductive features;
    removing the second material layer to expose portions of the plurality of conductive features;
    depositing a first etch stop layer on the exposed portions of the plurality of conductive features;
    depositing a second etch stop layer over an air gap between respective ones of the plurality of conductive features; and
    etching the first etch stop layer to form a via to at least one of the plurality of conductive features.

17. The method of claim 16, wherein the second etch stop layer is baked to encapsulate the air gap.

18. The method of claim 16, further comprising etching the insulating layer to form the air gap.

19. The method of claim 16, wherein the first etch stop layer comprises a nitride.

20. The method of claim 16, wherein the second etch stop layer comprises metallic nanoparticles.

* * * * *